US008035298B2

(12) United States Patent
Jeong et al.

(10) Patent No.: US 8,035,298 B2
(45) Date of Patent: Oct. 11, 2011

(54) ORGANIC LIGHT EMITTING DISPLAY HAVING ELECTROSTATIC DISCHARGE PROTECTION

(75) Inventors: Seoni Jeong, Youngin-si (KR); Woongsik Choi, Youngin-si (KR)

(73) Assignee: Samsung Mobile Display Co., Ltd. (KR)

( * ) Notice: Subject to any disclaimer, the term of this patent is extended or adjusted under 35 U.S.C. 154(b) by 438 days.

(21) Appl. No.: 11/975,037

(22) Filed: Oct. 16, 2007

(65) Prior Publication Data
US 2008/0174238 A1    Jul. 24, 2008

(30) Foreign Application Priority Data
Jan. 19, 2007  (KR) .................. 10-2007-0006306

(51) Int. Cl.
*H01J 1/62* (2006.01)
(52) U.S. Cl. ........ 313/506; 313/504; 313/505; 313/500; 313/498; 345/82
(58) Field of Classification Search .................... 313/506
See application file for complete search history.

(56) References Cited

U.S. PATENT DOCUMENTS

| 5,220,443 | A | | 6/1993 | Noguchi |
| 5,677,745 | A | * | 10/1997 | Kawano et al. ............. 349/42 |
| 5,824,235 | A | | 10/1998 | Yamazaki et al. |
| 5,909,035 | A | * | 6/1999 | Kim ........................ 257/59 |
| 5,926,234 | A | * | 7/1999 | Shiraki et al. ............ 349/40 |
| 7,772,766 | B2 | * | 8/2010 | Aoki ........................ 313/506 |
| 7,893,899 | B2 | * | 2/2011 | Jeong et al. ............. 345/82 |
| 2004/0075094 | A1 | * | 4/2004 | Yamazaki et al. ............ 257/72 |
| 2005/0023614 | A1 | | 2/2005 | Lai |
| 2005/0078232 | A1 | * | 4/2005 | Lo et al. .................. 349/40 |
| 2005/0151194 | A1 | | 7/2005 | Chen et al. |
| 2005/0186715 | A1 | | 8/2005 | Chen et al. |
| 2006/0278929 | A1 | | 12/2006 | Lin et al. |

FOREIGN PATENT DOCUMENTS

| JP | 06-289417 A | 10/1994 |
| JP | 07-191349 | 7/1995 |
| JP | 10-142626 A | 5/1998 |
| JP | 2005-51193 A | 2/2005 |
| JP | 2005-258423 | 9/2005 |
| KR | 10-2002-0056695 A | 7/2002 |
| KR | 10-2005-0011900 A | 1/2005 |
| KR | 20040015940 | * 10/2006 |
| WO | WO 97/10529 | 3/1997 |

OTHER PUBLICATIONS

Machine English translation of KR 20040015940 to Kim et al.*

(Continued)

*Primary Examiner* — Sikha Roy
(74) *Attorney, Agent, or Firm* — Knobbe Martens Olson & Bear, LLP

(57) ABSTRACT

An organic light emitting display in which an electrostatic discharge circuit is formed on a non-pixel area of a substrate is disclosed. The electrostatic discharge circuit comprises a first electrode layer, a first insulating layer formed on the first electrode layer and a second electrode layer formed on the first insulating layer. The first electrode layer and the second electrode layer each comprise a protruding electrode formed to extend horizontally toward the other of the first and second electrode layers. According to the organic light emitting display, it is possible to prevent a pixel and a driver included in the organic light emitting display from being damaged by electrostatic discharge by dissipating the electrostatic discharge current through the protruding electrode.

27 Claims, 4 Drawing Sheets

OTHER PUBLICATIONS

English translation of KR 2002-0056695 to Yu et al.*
Japanese Office Action dated Oct. 19, 2010 issued for Japanese Patent Application No. JP2007-036422 which corresponds to the captioned application.

Japanese Notice of Allowance dated May 17, 2011 for Japanese Patent Application No. JP 2007-036422 which shares priority of Korean Patent Application No. KR 10-2007-0006306 with the captioned U.S. Appl. No. 11/975,037.

* cited by examiner

ORGANIC LIGHT EMITTING DISPLAY HAVING ELECTROSTATIC DISCHARGE PROTECTION

CROSS-REFERENCE TO RELATED APPLICATIONS

This application claims the benefit of Korean Patent Application No. 10-2007-0006306, filed on Jan. 19, 2007, in the Korean Intellectual Property Office, the disclosure of which is incorporated herein by reference.

BACKGROUND

1. Field of the Invention

The field relates to an organic light emitting display, and more particularly, to an organic light emitting display that can prevent a pixel and a driver included in the organic light emitting display from being damaged due to electrostatic discharge.

2. Description of the Related Technology

An organic light emitting display is a kind of flat panel display and uses an organic light emitting diode (OLED) which emits light by recombination of electrons supplied from a cathode with holes supplied from an anode. The organic light emitting display has advantageous aspects of being thin, having a wide viewing angle, and having a short response time.

Methods for driving the organic light emitting display include a passive matrix method and an active matrix method. The passive matrix method is a method that selects and drives a line where an anode and a cathode intersect at right angles. On the other hand, the active matrix method is a method that realizes an image by supplying an organic light emitting diode (OLED) with a driving current corresponding to a data signal. The organic light emitting diode (OLED) uses a thin film transistor (TFT) formed on each pixel. The active matrix method has an advantageous aspect that it can exhibit more stable brightness and can consume less power than the passive matrix method, and thus it can be applied to large and high-resolution displays.

A conventional organic light emitting display comprises a pixel area including a pixel matrix and a non-pixel area including a power supply and a driver for driving the pixel. The pixel of the pixel area includes a thin film transistor and an organic light emitting diode for a driving operation or a switching operation. The pixel area and the non-pixel area are electrically coupled with each other through a plurality of lines.

The conventional organic light emitting display is manufactured by forming a thin film transistor, forming an organic light emitting diode, encapsulating, and packaging. During such manufacturing steps, static electricity can be generated in the organic light emitting display by internal environmental factors or by external environmental factors. The static electricity can be generated during nearly all manufacturing processes for manufacturing the organic light emitting display including a deposition process, an etching process, etc. Furthermore, the static electricity can also be generated by an external environmental factor during displaying an image on the organic light emitting display.

According to the conventional light emitting display, a problem is that an internal circuit is damaged due to electrostatic discharge (ESD) that occurs during the above-mentioned or other manufacturing steps or by an external environmental factor.

SUMMARY OF CERTAIN INVENTIVE ASPECTS

Some aspects solve the aforementioned problems of the conventional organic light emitting display and provide an organic light emitting display that can prevent a pixel and a drive included in the organic light emitting display from being damaged due to electrostatic discharge.

One aspect is an organic light emitting display including a substrate including a pixel area and a non-pixel area, and an electrostatic discharge circuit formed in the non-pixel area, the electrostatic discharge circuit including a first electrode layer formed on the substrate, a first insulating layer formed on the first electrode layer, and a second electrode layer formed on the first insulating layer, where at least one of the first electrode layer and the second electrode layer includes a protruding electrode formed to extend horizontally toward the other of the first electrode layer and the second electrode layer.

Another aspect is an organic light emitting display including a substrate including a pixel area and a non-pixel area, and an electrostatic discharge circuit in the non-pixel area, the electrostatic discharge circuit including a semiconductor layer formed on the substrate, a gate insulating layer formed on the semiconductor layer, a gate electrode formed on the gate insulating layer, an insulating interlayer formed to cover the gate electrode, and a source/drain electrode formed on the insulating interlayer, where the gate electrode includes a first protruding electrode formed to extend horizontally toward the source/drain electrode.

BRIEF DESCRIPTION OF THE DRAWINGS

The above and other objects, features and advantages will be more apparent from the following detailed description taken in conjunction with the accompanying drawings, in which.

DETAILED DESCRIPTION CERTAIN INVENTIVE EMBODIMENTS

Figure 1:
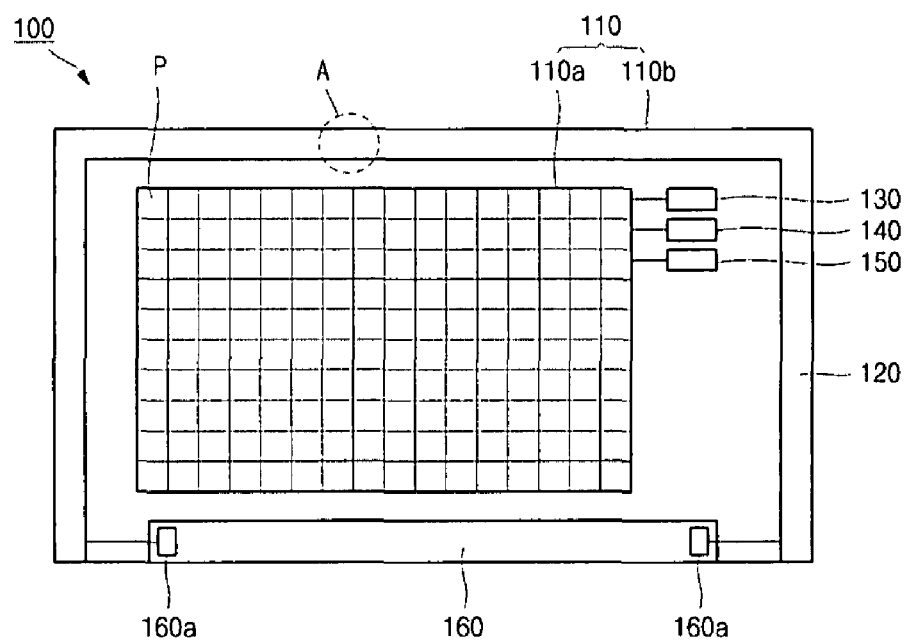
FIG. 1 is a schematic view showing an organic light emitting display according to an embodiment.

Hereinafter, certain embodiments will be described with reference to the accompanying drawings. In the drawings, for the purpose of clear explanation, portions that are not related to such an explanation will be sometimes omitted.

An organic light emitting display according to an embodiment will be explained.

FIG. 1 is a schematic view showing an organic light emitting display 100 according to an embodiment.

Referring to FIG. 1, an organic light emitting display 100 according to an embodiment includes: a substrate 110 which includes a pixel area 110a including pixels P arranged in the form of a matrix and a non-pixel area 110b formed on the outer circumference of the pixel area 110a; and an electrostatic discharge circuit 120 formed on the non-pixel area 110b.

The substrate 110 includes the pixel area 110a having approximately a rectangular shape and the non-pixel area 110b formed on the outer circumference of the pixel area 110a. The substrate 110 can be further electrically coupled with a data drive 130, a scan drive 140 and a light emission control drive 150.

The pixel area 110a is an area that displays an image by driving a plurality of pixels arranged in the form of a matrix. Each pixel is formed near an area where a data line (not shown), a scan line (not shown) and a light emission control line (not shown) intersect with each other. Although not shown in FIG. 1, the pixel P can include a driving element formed by a thin film transistor, at least one switching element, a capacitive element and an organic light emitting diode.

The non-pixel area 110b is formed on the substrate 110 surrounding the pixel area 110a. In the non-pixel area 110b, the electrostatic discharge circuit 120, the data driver 130 for supplying each of the data line, the scan line and the light emission control line which define the pixel P with a driving signal, the scan driver 140 and the light emission control driver 150 can be formed. Furthermore, the non-pixel area 110b can include a pad 160 for electrically coupling the pixel P, the data driver 130, the scan driver 140 and the light emission control driver 150 with an external module.

The electrostatic discharge circuit 120 is formed on the non-pixel area 110b of the substrate 110. The electrostatic discharge circuit 120 can be formed on one or more sides of the end of the substrate 110. In this embodiment, the electrostatic discharge circuit 120 is formed on each side of the substrate 110 except a portion where the pad 160 is. The electrostatic discharge circuit 120 can be formed as a single piece to surround each side of the substrate 110. The electrostatic discharge circuit 120 protects an inner part, for example, a driving element, a switching element or an organic light emitting diode included in the pixel from being damaged due to electrostatic discharge (ESD) which can occur during a manufacturing process or a subsequent handling process of the organic light emitting display 100. The electrostatic discharge circuit 120 can also protect circuits formed on the non-pixel area 110b such as the data driver 130, the scan driver 140, the light emission control driver 150 and the pad 160 and so on which will be described later. Although the electrostatic discharge circuit 120 has been described as being formed on the end of the substrate, the invention is not limited thereto. Of course, the electrostatic discharge circuit 120 can be formed on another area of the substrate 110. Detailed structure of the electrostatic discharge circuit 120 will be described later.

The data driver 130, the scan driver 140 and the light emission control driver 150 can be placed on the non-pixel area 110b of the substrate 110 as an integrated circuit (IC). The data driver 130, the scan driver 140 and the light emission control driver 150 can be formed on the same layer as the layer forming a thin film transistor (not shown) included in the pixel P of the pixel area 110a. On the other hand, the data driver 130, the scan driver 140 and the light emission control driver 150 can be formed not on the substrate 110 but on another separate substrate. The respective drivers 130, 140 and 150 formed on another separate substrate (not shown) can be electrically coupled with the substrate 110 by any of, for example, a tape carrier package (TCP), a flexible printed circuit (FPC), a tape carrier package (TAB), a chip on glass (COG) and their equivalents, but is not limited thereto.

The pad 160 is formed on the non-pixel area 110b of the substrate 110. The pad 160 is formed on one side of the substrate 110, and is configured to electrically couple an external circuit module (not shown) with the drivers 130, 140 and 150, or is formed to electrically couple an external circuit module with the pixel P. The electrostatic discharge circuit 120 can be electrically coupled with a ground pad 160a that is formed on at least one side of the pad 160.

The electrostatic discharge circuit 120 that is used for the organic light emitting display 100 according to some embodiments of the present invention will be described in further detail.

Figure 2:
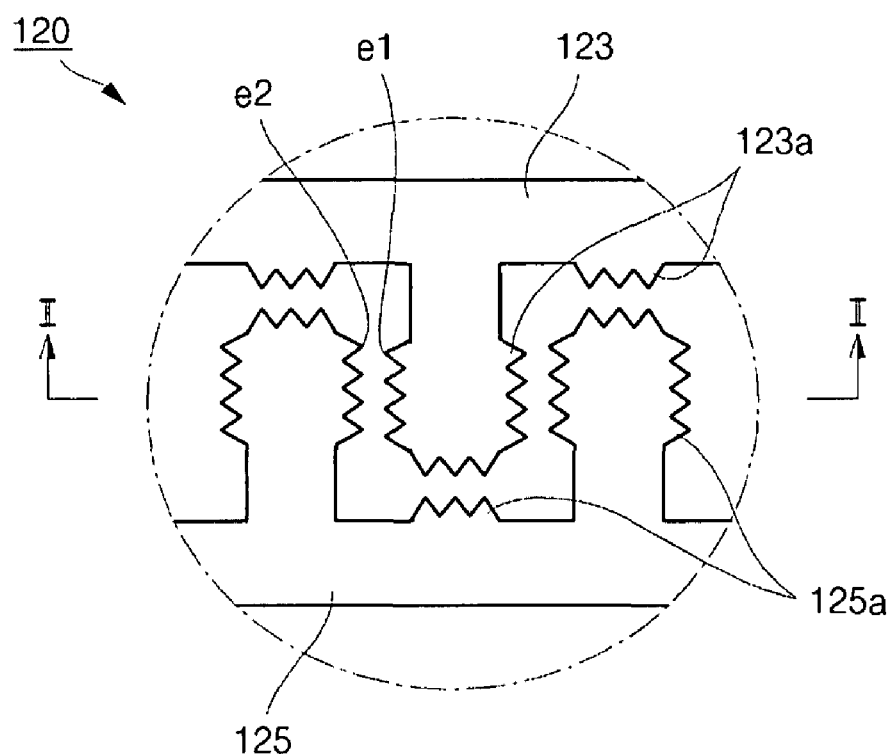
FIG. 2 is a plan view showing "A" portion of FIG. 1.
Figure 3:
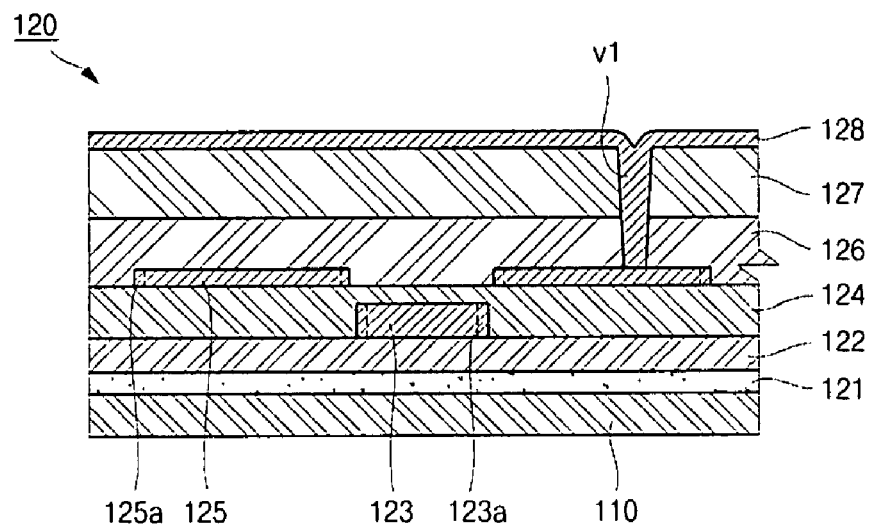
FIG. 3 is a vertical cross-sectional view taken along the line I-I of FIG. 2.

FIG. 2 is a plan view showing the "A" portion of FIG. 1, and FIG. 3 is a vertical sectional view of the electrostatic discharge circuit 120 taken along the line I-I of FIG. 2. The electrostatic discharge circuit 120, which will be described hereinafter, can be applied to the electrostatic discharge circuit 120 that is formed not only on a portion ("A" of FIG. 1) but also on all other areas of the substrate 110.

Referring to FIGS. 2 and 3, the electrostatic discharge circuit 120 of the organic light emitting display 100 according to some embodiments includes a buffer layer 121 formed on the top of the substrate 110, a gate insulating layer 122 formed on the top of the buffer layer 121, a gate electrode 123 (optionally referred to as a "first electrode layer") formed on the top of the gate insulating layer 122, an insulating interlayer 124 (optionally referred to as a "first insulating layer") formed to cover the gate electrode 123, and a source/drain electrode 125 (optionally referred to as a "second electrode layer") formed on the top of the insulating interlayer 124. Furthermore, the electrostatic discharge circuit 120 can further include a first protective layer 126 formed to cover the source/drain electrode 125, a second protective layer 127, and a third electrode layer 128 which is formed on the top surface of the second protective layer 127 and is electrically coupled with the source/drain electrode 125. In some embodiments, the gate electrode 123 can include a first protruding electrode 123a formed to extend horizontally. Furthermore, the source/drain electrode 125 can include a second protruding electrode 125a formed to extend horizontally.

The substrate 110 is formed in the form of a plate with top and bottom surfaces, and the thickness between the top and bottom surfaces is from about 0.05 mm to about 1 mm. If the thickness of the substrate 110 is below about 0.05 mm, a disadvantage is caused that the substrate is liable to damage during cleaning, etching and heat treatment processes and has a low resistance to an external force. Moreover, if the thickness of the substrate 110 is above about 1 mm, it is difficult to apply the substrate to various display devices that are thin. The substrate 110 can be formed of at least one of an ordinary glass, a plastic, a stainless steel and their equivalents, but not limited thereto. The substrate 110 may be formed by pre-compacting the substrate 110 to prevent it from being readily deformed due to a heat or a pressure in the step of cleaning the substrate to prevent it from containing foreign substances and in the step of manufacturing other components. The substrate 110 can be divided into the pixel area 110a including the thin film transistor and the organic light emitting diode and the non-pixel area 110b on which various drivers are formed.

The buffer layer 121 serves at least for preventing moisture ($H_2O$), hydrogen ($H_2$), oxygen ($O_2$), etc. from penetrating through the substrate 110 and infiltrating into the electrostatic discharge circuit 120. For this purpose, the buffer layer 121 can be formed of a silicon oxide layer ($SiO_2$), a silicon nitride layer ($Si_3N_4$), an organic layer and their equivalents that can be easily formed during a semiconductor process, but not limited thereto. Of course, the buffer layer 121 can be formed in a multilayer structure, or can be omitted.

The gate insulating layer 122 is formed on the top surface of the buffer layer 121. The gate insulating layer 122 is formed between the gate electrode 123, which will be described later, and the buffer layer 121 to obtain the electrical desired insulating. The gate insulating layer 122 can be formed of any of a silicon oxide layer, a silicon nitride layer, an organic layer or their equivalents that can be easily formed during a semiconductor process, but not limited thereto. The gate insulating layer 122 can be formed by any of a PECVD method, an LPCVD method, a sputtering method and other methods.

The gate electrode 123 is formed on the top of the gate insulating layer 122. The gate electrode 123 can be electrically coupled with the ground pad 160*a* (see FIG. 1) included in the pad 160 (see FIG. 1). The gate electrode 123 can be, for example, formed of any of aluminum (Al), aluminum-neodymium (AlNd), chrome (Cr), molybdenum (Mo), molybdenum-tungsten (MoW) and titanium (Ti) or can be formed of a metal material made by their combinations, but is not limited thereto. After being deposited on the gate insulating layer 122, the gate electrode 123 can be positioned at the desired position in the desired number through processes of applying a photoresist, exposing, developing, etching, separating the photoresist and so on. The gate electrode 123 serves for inducing the break down of the insulating interlayer 124, which will be described later, and discharging the static electricity. Furthermore, the gate electrode 123 can ground the static electricity by the ground pad 160*a* included in the pad 160 (see FIG. 1). The gate electrode 123 can include the first protruding electrode 123*a* for inducing relatively easily the electrostatic discharge.

The first protruding electrode 123*a* is formed to extend horizontally toward the source/drain electrode 125, which will be described later, in the gate electrode 123. As shown in FIG. 2, the first protruding electrode 123*a* can be formed in the shape of a saw-tooth formed in a portion of the gate electrode 123. Furthermore, the first protruding electrode 123*a* can be formed integrally with the gate electrode 123 and can be formed simultaneously with the gate electrode 123 in the process of forming the gate electrode 123. The first protruding electrode 123*a* can be formed such that its end e1 points toward the source/drain electrode 125 or the second protruding electrode 125*a* included in the source/drain electrode 125. The end e1 of the first protruding electrode 123*a* can be formed in an angular shape for allowing the static electricity charge to be concentrated for a relatively short time. The first protruding electrode 123*a* can be formed opposite to the second protruding electrode 125*a* which will be described later. In case that the electrostatic discharge occurs in the gate electrode 123, the first protruding electrode 123*a* severs for concentrating the static electricity charge to the angular end e1 and forming a high electric field. The shape of the first protruding electrode 123*a* is not limited to that shown in FIG. 2, however, the first protruding electrode can be formed in any shape that allows the static electricity charge to be concentrated.

The insulating interlayer 124 is formed on top of the gate electrode 123. Of course, the insulating interlayer 124 can also be formed on the gate insulating layer 122 which is formed on the outer circumference of the gate electrode 123. The insulating interlayer 124 can be formed of the same insulating material as the gate insulating layer 122 and may include a silicon oxide layer, a silicon nitride layer, an organic layer and so on, but is not limited thereto. The insulating interlayer 124 can be formed of any of a polymer-based insulating material, a plastic-based insulating material, a glass-based insulating material and their equivalents, but is not limited thereto. The insulating interlayer 124 serves for inducing the break down of insulation by the static electricity applied through the gate electrode 123 or the source/drain electrode 125.

The source/drain electrode 125 is formed on top of the insulating interlayer 124. The source/drain electrode 125 can be formed on the top of the insulating interlayer 124. The source/drain electrode 125 can be formed to be spaced apart from the gate electrode 123 in the horizontal direction. The source/drain electrode 125 can be electrically coupled with the ground pad 160*a* (see FIG. 1) formed on the pad 160 (see FIG. 1). The source/drain electrode 125 serves for inducing the break down of insulation of the insulating interlayer 124 formed between the source/drain electrode 125 and the gate electrode 123 and discharging the static electricity. The source/drain electrode 125 can ground the static electricity through the ground pad 160*a* (see FIG. 1). The source/drain electrode 125 can be formed of the same metal material as the gate electrode 123, but is not limited thereto. The source/drain electrode 125 can be deposited by any of, for example, a PECVD method, an LPCVD method, a sputtering method and their equivalent methods, and then can be patterned at the desired position in the desired number through processes of, for example, applying a photoresist, exposing, developing, etching and separating the photoresist. On the other hand, the source/drain electrode 125 can include the second protruding electrode 125*a* formed to extend horizontally in the source/drain electrode 125.

The second protruding electrode 125*a* is formed to extend horizontally toward the gate electrode 123 in the source/drain electrode 125. As shown in FIG. 2, the second protruding electrode 125*a* can be formed in the shape of a saw-tooth formed continuously in a portion of the source/drain electrode 125. Furthermore, the second protruding electrode 125*a* can be formed integrally with the source/drain electrode 125 and can be formed simultaneously with the source/drain electrode 125 in the process of forming the source/drain electrode 125. The second protruding electrode 125*a* can be formed such that its end e2 points toward the gate electrode 123 or the first protruding electrode 123*a* included in the gate electrode 123. Similarly to the end e1 of the first protruding electrode 123*a*, the end e2 of the second protruding electrode 125*a* can be formed in an angular shape for allowing the static electricity charge to be concentrated. In case that the electrostatic discharge occurs in the source/drain electrode 125, the second protruding electrode 125*a* severs for concentrating the static electricity charge to the angular end e2 and forming a high electric field.

Meanwhile, the distance (in the horizontal direction) between the source/drain electrode 125 and the gate electrode 123 can be varied depending on the voltage level of the static electricity to be controlled and the area of the electrostatic discharge circuit 120 to be formed in the non-pixel area 110*b*. If the voltage level of the static electricity to be controlled is relatively high (for example, above a few thousand volts), then the distance (in the horizontal direction) between the source/drain electrode 125 and the gate electrode 123 is formed as long as possible within the area able to forming the electrostatic discharge circuit 120. However, the distance (in the horizontal direction) between the source/drain electrode 125 and the gate electrode 123 is not limited.

The electrostatic discharge circuit 120 can further include a protective layer formed on the source/drain electrode 125. The protective layer can include the first protective layer 126 and the second protective layer 127. The first protective layer 126 is formed to cover the source/drain electrode 125 and the insulating interlayer 124 and serves for protecting the source/drain electrode 125 and the gate electrode 123. The first protective layer 126 can be formed of any one selected from an ordinary organic layer and its equivalent, but is not limited thereto. Furthermore, the second protective layer 127 is formed to cover the first protective layer 126 and serves for aiding the surface of the electrostatic discharge circuit 120 to be substantially planar. The second protective layer 127 can be formed of at least one of benzo cyclo butene (BCB), acryl and their equivalents, but is not limited thereto.

Furthermore, the electrostatic discharge circuit 120 can further include the third electrode layer 128 on the top surface of the second protective layer 127. The third electrode layer 128 is electrically coupled with the source/drain electrode 125 through an electrically conductive via hole v1. The third electrode layer 128 can be formed of the same metal material as the gate electrode 123 and the source/drain electrode 125, but is not limited thereto. The third electrode layer 128 aids the static electricity to be discharged to the source/drain electrode 125 through the electrically conductive via hole v1 when the static electricity is generated.

According to the above-mentioned embodiment, the electrostatic discharge circuit 120 is formed on at least one side of the non-pixel area 110b which is on the outer circumference of the pixel area 110a of the organic light emitting display 100, and prevents the pixels P and the drivers 130, 140 and 150 from being damaged due to the electrostatic discharge.

More specifically, the electrostatic discharge current is conducted through the insulating interlayer 124 between the gate electrode 123 and the source/drain electrode 125. The static electricity from the gate electrode 123 or the source/drain electrode 125 is discharged by the break down of insulation of the insulating interlayer 124. A portion of the static electricity can be grounded by any one of the gate electrode 123 and the source/drain electrode 125. Furthermore, the static electricity generated in the outside of the electrostatic discharge circuit 120 can be transferred to the source/drain electrode 125 through the third electrode layer 128 and can be discharged thereby.

The electrostatic discharge circuit 120 has an advantageous effect that allows the static electricity to be relatively easily dissipated with the first protruding electrode 123a and the second protruding electrode 125a which form a high electric field due to the concentration of the static electricity charge and thus facilitating the break down of the insulation.

More specifically, the ends e1 and e2 of the first and second protruding electrodes 123a and 125a are formed in an angular shape. Hence, the static electricity charge is concentrated at the ends e1 and e2 when the static electricity is generated, and thus relatively high electric field can be formed at the ends e1 and e2. The end e1 of the first protruding electrode 123a and the end e2 of the second protruding electrode 125a face each other, and the break down of insulation of the insulating interlayer 124 between the first protruding electrode 123a and the second protruding electrode 125a by the electrostatic discharge is facilitated. Accordingly, the electrostatic discharge can be dissipated more easily by the first protruding electrode 123a and the second protruding electrode 125a.

Next, another example of the protruding electrodes 123a and 125a in the electrostatic discharge circuit 120 will be described.

Figure 4:
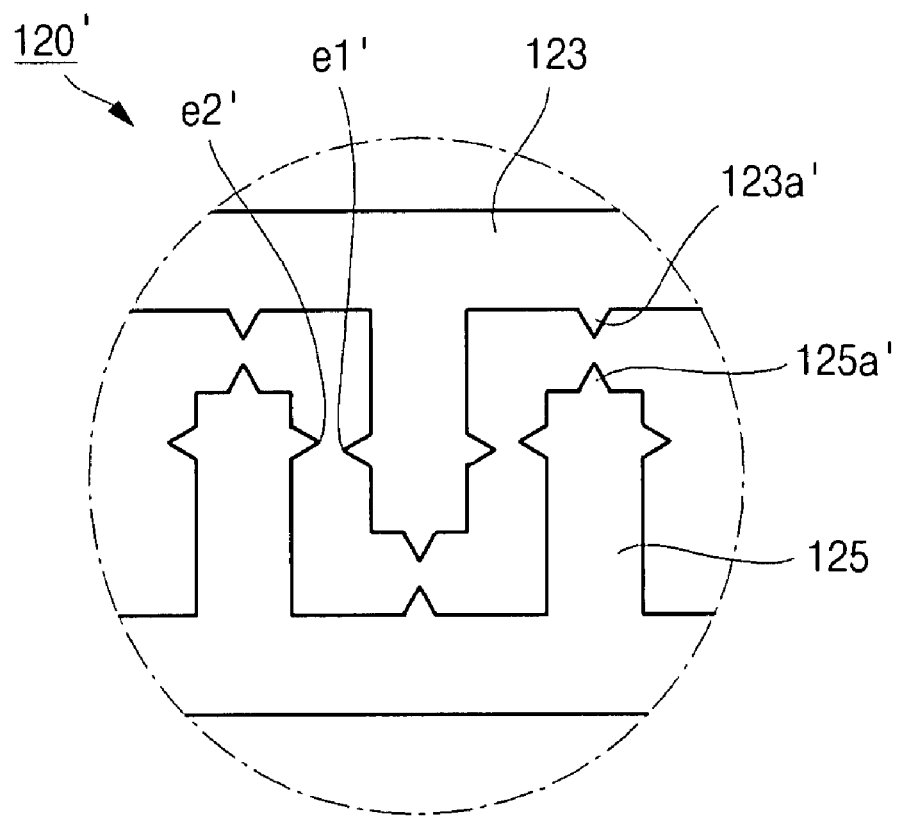
FIG. 4 is a plan view showing a portion, which corresponds to FIG. 2, of another example of an electrostatic discharge circuit.
Figure 5:
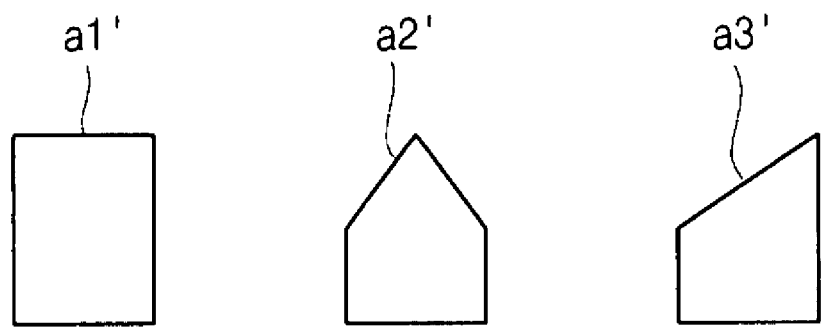
FIG. 5 is a view showing other shapes of protruding electrodes of FIG. 4.

FIG. 4 is a view showing a portion, which corresponds to FIG. 2, of another electrostatic discharge circuit 120', and FIG. 5 is a view showing other shapes of protruding electrodes 123a' and 125a' of FIG. 4.

The electrostatic discharge circuit 120' is similar to that of the electrostatic discharge circuit 120 of FIGS. 2 and 3. An explanation of the protruding electrodes 123a' and 125a' will be made hereinafter.

The electrostatic discharge circuit 120' includes a first protruding electrode 123a' formed to extend horizontally in the gate electrode 123 and a second protruding electrode 125a' formed to extend horizontally in the source/drain electrode 125.

The first protruding electrode 123a' and the second protruding electrode 125a' can be formed on at least a portion of the gate electrode 123 and the source/drain electrode 125 in the form of a triangle, respectively. The first protruding electrode 123a' and the second protruding electrode 125a' can be formed such that one side thereof is formed on the gate electrode 123 and the source/drain electrode 125 and a vertex which is opposite to the one side points toward the opposite electrode respectively. That is, in the first protruding electrode 123a' and the second protruding electrode 125a' formed in the form of a triangle, the above-mentioned vertices can be ends e1' and e2'. The end e1' of the first protruding electrode 123a' and the end e2' of the second protruding electrode 125a' can be formed facing each other. As described above, the ends e1' and e2', which are formed on the protruding electrodes 123a' and 125a' respectively, are formed as the vertices, and thus perform similarly to the operation as the above-described embodiment. The static electricity charge transferred through the gate electrode 123 and the source/drain electrode 125 is concentrated to the ends e1' and e2', and relatively high electric field is formed between the ends e1' and e2', and thus the break down of insulation between the gate electrode 123 and the source/drain electrode 125 (the break down of insulation through the insulating interlayer 124) can be facilitated.

As shown in FIG. 5, each of the first protruding electrode 123a' and the second protruding electrode 125a' can be formed in the form of any of a rectangle a1', a pentagon a2' and a trapezoid a3'. However, the shapes of the first protruding electrode 123a' and the second protruding electrode 125a' are not limited thereto, and the shapes thereof can be varied.

The first protruding electrode 123a' and the second protruding electrode 125a' have an advantageous aspect that they can be formed at the desired position of the gate electrode 123 and the source/drain electrode 125 in the desired number respectively. Accordingly, by forming the protruding electrodes 123a' and 125a' on a portion where the static electricity is intensively generated or a portion vulnerable to the static electricity, the break down of insulation by the static electricity can be more easily induced.

Next, an organic light emitting display according to another embodiment will be described hereinafter.

Figure 6:
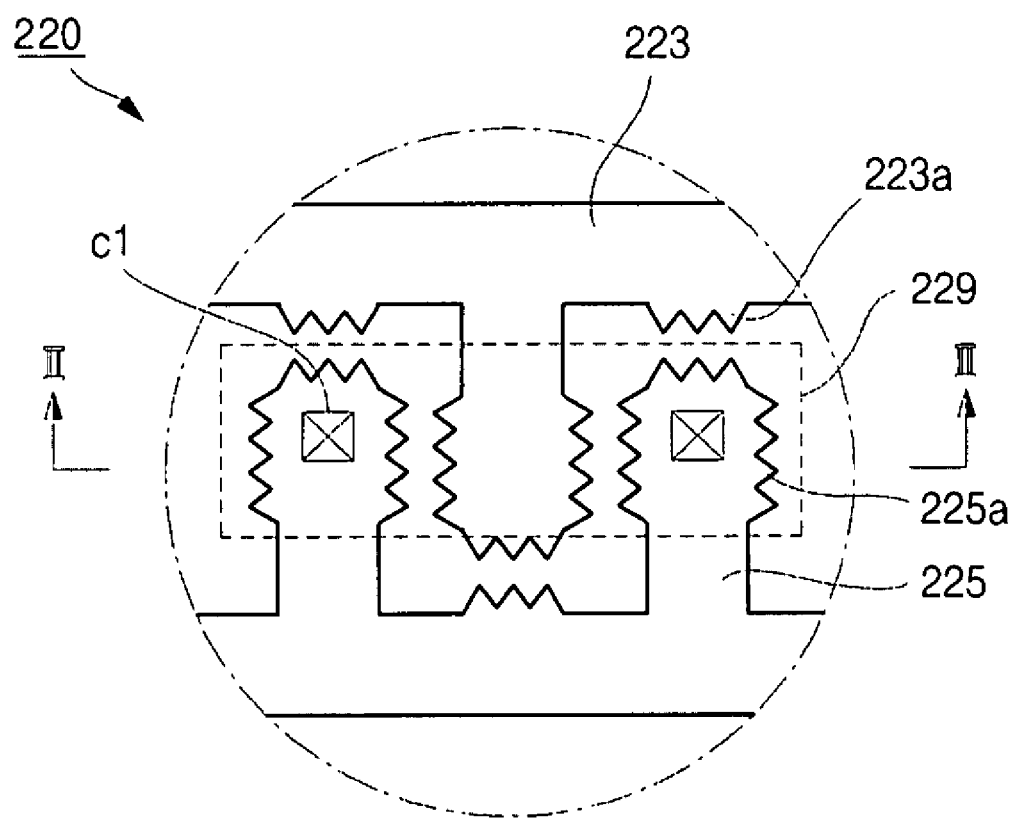
FIG. 6 is a plan view showing a portion, which corresponds to FIG. 2, of an organic light emitting display according to another embodiment.
Figure 7:
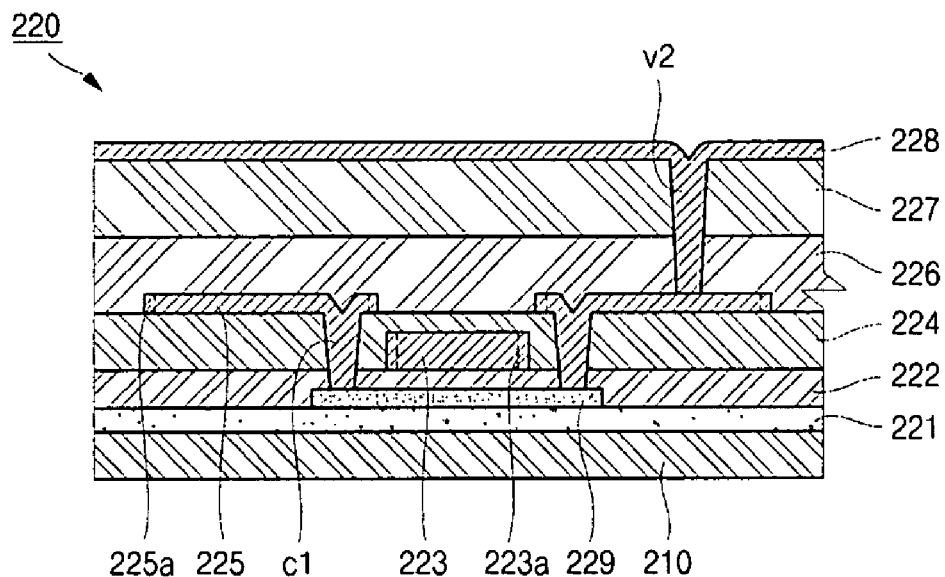
FIG. 7 is a vertical cross-sectional view taken along the line II-II of FIG. 6.

FIG. 6 is a plan view showing a portion, which corresponds to FIG. 2, of an organic light emitting display according to another embodiment, and FIG. 7 is a vertical cross-sectional view taken along the line II-II of FIG. 6. Since the organic light emitting display of this embodiment is similar to that of the embodiment shown in FIGS. 1 to 4, an explanation emphasizing the different features will be made hereinafter.

Referring to FIGS. 6 and 7, an electrostatic discharge circuit 220 of the organic light emitting display according to this embodiment includes a buffer layer 221 formed on the top of a substrate 210, a semiconductor layer 229 formed on the top of the buffer layer 221, a gate insulating layer 222 formed on the top of the semiconductor layer 229, a gate electrode 223 formed on the top of the gate insulating layer 222, an insulating interlayer 224 formed to cover the gate electrode 223, and a source/drain electrode 225 formed on the top of the insulating interlayer 224. Furthermore, the electrostatic discharge circuit 220 can further include a first protective layer 226 formed to cover the source/drain electrode 225, a second protective layer 227, and a third electrode layer 228 which is formed on the top surface of the second protective layer 227 and is electrically coupled with the source/drain electrode 225 through a via hole v2. The gate electrode 223 can include a first protruding electrode 223a formed to extend horizontally in the gate electrode 223. Furthermore, the source/drain electrode 225 can include a second protruding electrode 225a formed to extend horizontally in the source/drain electrode 225. Some embodiments can be formed with the same structure and material as the above-mentioned embodiments except that the semiconductor layer 229 is formed on the top of the buffer layer 221.

The semiconductor layer 229 can be formed on the buffer layer 221 or the substrate 210. The semiconductor layer 229 serves for inducing the electrostatic discharge together with the gate electrode 23 and the source/drain electrode 225. The semiconductor layer 229 can be formed of any one selected from amorphous silicon, micro silicon (silicon having a grain size between amorphous silicon and polycrystalline silicon), an organic matter and their equivalents, but is not limited thereto. The semiconductor layer 229 can be electrically coupled with the source/drain electrode 225 through an electrically conductive contact c1 that is formed to penetrate the insulating interlayer 224. The semiconductor layer 229 includes source and drain areas (not shown) formed on both sides opposite to each other, a channel area (not shown) formed between the source and drain areas. After crystallizing amorphous silicon or micro silicon into polycrystalline silicon, the semiconductor layer 229 can be formed in the desired position and shape through patterning.

The amorphous silicon can be crystallized by a laser crystallization method using an excimer laser, a metal induced crystallization (MIC) method using a metal promoting material, and a sold phase crystallization (SPC) method. Furthermore, there is a sequential lateral solidification (SLS) method which further uses a mask in the existing laser crystallization method. The laser crystallization method is the most widely used method. According to the laser crystallization method, it is possible to use the existing crystallization method of a polycrystalline liquid crystal display, the processing method is simple, and the technical development about the processing method has been completed.

The metal induced crystallization method is one of methods that can crystallize at a low temperature without using the laser crystallization method. The metal induced crystallization method has an advantageous effect in that a metal promoting material such as Ni, Co, Pd, Ti, etc. is initially deposited or spin-coated on the surface of the amorphous silicon, and then the metal promoting material is directly penetrated into the surface of the amorphous silicon, thereby crystallizing the amorphous silicon at a low temperature while changing the phase thereof.

Another metal induced crystallization method that uses a mask when applying a metal layer on the surface of the amorphous silicon is to prevent a contaminant such as a nickel silicide from depositing on a specific area of a thin film transistor. This crystallization method is referred to as a metal induced lateral crystallization (MILC) method. The mask used for the metal induced lateral crystallization method may be a shadow mask, and the shadow mask may be a linear mask or a dotted mask.

Another metal induced crystallization method is a metal induced crystallization with capping layer (MICC) method which applies the capping layer on the surface of the amorphous silicon before depositing or spin-coating the metal promoting material layer thereon and controls the amount of a metal promoting material introduced into the amorphous silicon. As the capping layer, a silicon nitride layer can be used. The amount of the metal promoting material to be introduced into the amorphous silicon from the metal promoting material layer varies depending on the thickness of the silicon nitride layer. At this time, the metal promoting material introduced into the silicon nitride layer can be formed on the entire silicon nitride layer or can be selectively formed by using the shadow mask. After the metal promoting material layer crystallizes the amorphous silicon into the polycrystalline silicon, it is possible to selectively remove the capping layer. As a method for removing the capping layer, a wet etching method or a dry etching method can be used.

The micro silicon typically refers to silicon having a crystal grain size of 1 nm to 100 nm. The micro silicon is characterized in that its electron mobility is from 1 to 50 and its hole mobility is from 0.01 to 0.2. The micro silicon is characterized in that its crystal grain size is smaller than that of the polycrystalline silicon. Furthermore, a protrusion area between crystal grains of the micro silicon is formed small, and thus electron movement between the crystal grains does not hindered, thereby exhibiting uniform characteristics. As a method for crystallizing the micro silicon, there are a thermal crystallization method and a laser crystallization method. The thermal crystallization method includes a method that obtains a crystallization structure simultaneously with the deposition of the amorphous silicon, and a reheating method. The laser crystallization method is a crystallization method that crystallizes using a laser after depositing the amorphous silicon by a chemical vapor deposition method, and the laser employed is mainly a diode laser. The diode laser mainly uses a red wavelength of 800 nm range, and the red wavelength serves for allowing the micro silicon to be uniformly crystallized.

The polycrystalline silicon formed by the above-mentioned method is positioned at the desired position in the desired number through processes of applying a photoresist, exposing, developing, etching, separating the photoresist and so on.

In the source/drain electrode 225, an electrode contacted with the source area and the drain area is integrally formed. Hence, the electrostatic discharge circuit 220 is not operated when a usual driving voltage is applied.

Meanwhile, the first protruding electrode 223a and the second protruding electrode 225a according to another embodiment can be formed in a similar manner as the first protruding electrode 123a and the second protruding electrode 125a of the above-mentioned embodiments, and the operation of the first protruding electrode 223a and the second protruding electrode 225a is similar to the operation of the first protruding electrode 123a and the second protruding electrode 125a.

According to the above-mentioned embodiments, the electrostatic discharge circuit 220 has an advantageous effect that since the static electricity can be discharged through the insulating interlayer 224 formed between the gate electrode 223 and the source/drain electrode 225 and the electrostatic discharge current can be conducted through the gate insulating layer 222 formed between the gate electrode 223 and the semiconductor layer 229 or through the gate insulating layer 222 and the insulating interlayer 224 between the source/drain electrode 225 and the semiconductor layer 229, it is possible to dissipate the electrostatic discharge by using other paths also.

Furthermore, by forming the first protruding electrode 223a and the second protruding electrode 225a, at which the static electricity is concentrated, on the gate electrode 223 and the source/drain electrode 225, it is possible to dissipated more easily the electrostatic charge current. The operation of the first protruding electrode 223 and the second protruding electrode 225*a* is similar to the operation of the above-mentioned embodiments.

Figure 8:
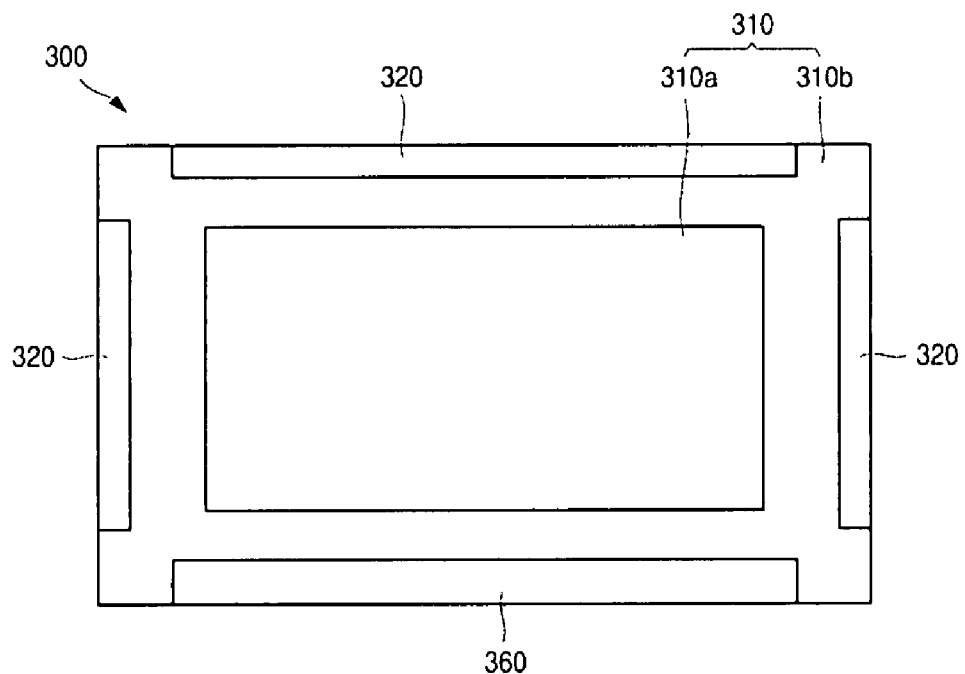
FIG. 8 is a schematic view showing an organic light emitting display according to another embodiment.

FIG. 8 is a schematic view showing an organic light emitting display according to yet another embodiment.

Referring to FIG. 8, the organic light emitting display 300 according to yet another embodiment includes an electrostatic discharge circuit 320 that is separately formed on each side of a substrate 310 including a pixel area 310*a* and a non-pixel area 310*b*. Hence, it is an advantageous effect that the electrostatic discharge circuit 320 can be selectively formed only on an area where the electrostatic discharge is expected to occur, or another desired area. According to yet another embodiment each electrostatic discharge circuit 320 can be electrically coupled with a ground pad (not shown) of a pad 360 formed on the substrate 310. The detailed structure of the electrostatic discharge circuit 320 according to this embodiment can be formed in a similar manner as the above-mentioned embodiments and the operation and the advantageous effect of the electrostatic discharge circuit 320 is also similar the above-mentioned embodiments.

The organic light emitting diode included in the pixel P comprises, for example, an anode (ITO), an organic layer and a cathode (metal). The organic layer can be composed of an emitting layer (EML) which emits light by recombining electrons and holes and forming excitons, an electron transport layer (ETL) which transports electrons, and a hole transport layer (HTL) which transports holes. Furthermore, an electron injecting layer (EIL) which injects electrons can be formed on one side of the electron transport layer, and a hole injecting layer (HIL) which injects holes can be formed on one side of the hole transport layer. Moreover, in case of a phosphorescent organic light emitting diode, a hole blocking layer (HBL) can be selectively formed between the emitting layer (EML) and the electron transport layer (ETL), and an electron blocking layer (EBL) can be selectively formed between the emitting layer (EML) and the hole transport layer (HTL).

Furthermore, the organic layer can be formed as a slim organic light emitting diode with two kinds of layers with reduced thickness. For example, it is possible to selectively form a hole injection transport layer (HITL) forming the hole injecting layer and the hole transport layer simultaneously and an electron injection transport layer (EITL) forming the electron injecting layer and the electron transport layer simultaneously. The slim organic light emitting diode is used to increase the light emission efficiency. Furthermore, a buffer layer can be formed between the anode (ITO) and the emitting layer as an optional layer. The buffer layer is divided into an electron buffer layer for buffering an electron and a hole buffer layer for buffering a hole.

The electron buffer layer can be selectively formed between the cathode (metal) and the electron injecting layer (EIL) and can function as a substitute for the electron injecting layer (EIL). The stack structure of the organic layer can be the emission layer (EML)/electron transport layer (ETL)/electron buffer layer/cathode (metal). Furthermore, the hole buffer layer can be selectively formed between the anode (ITO) and the hole injecting layer (HIL) and can function as a substitute for the hole injecting layer (HIL). At this time, the stack structure of the organic layer can be the anode (ITO)/hole buffer layer/hole transport layer (HTL)/emission layer (EML).

Possible stack structures are as follows:

a) Normal Stack Structure 1) the anode/hole injecting layer/hole transport layer/emitting layer/electron transport layer/electron injecting layer/cathode 2) the anode/hole buffer layer/hole injecting layer/hole transport layer/emitting layer/electron transport layer/electron injecting layer/cathode 3) the anode/hole injecting layer/hole transport layer/emitting layer/electron transport layer/electron injecting layer/electron buffer layer/cathode 4) the anode/hole buffer layer/hole injecting layer/hole transport layer/emitting layer/electron transport layer/electron injecting layer/electron buffer layer/cathode 5) the anode/hole injecting layer/hole buffer layer/hole transport layer/emitting layer/electron transport layer/electron injecting layer/cathode 6) the anode/hole injecting layer/hole transport layer/emitting layer/electron transport layer/electron buffer layer/electron injecting layer/cathode b) Normal Slim Structure 1) the anode/hole injection transport layer/emitting layer/electron transport layer/electron injecting layer/cathode 2) the anode/hole buffer layer/hole injection transport layer/emitting layer/electron transport layer/electron injecting layer/cathode 3) the anode/hole injecting layer/hole transport layer/emitting layer/electron injection transport layer/electron buffer layer/cathode 4) the anode/hole buffer layer/hole transport layer/emitting layer/electron injection transport layer/electron buffer layer/cathode 5) the anode/hole injection transport layer/hole buffer layer/emitting layer/electron transport layer/electron injecting layer/cathode 6) the anode/hole injecting layer/hole transport layer/emitting layer/electron buffer layer/electron injection transport layer/cathode c) Inverted Stack Structure 1) the cathode/electron injecting layer/electron transport layer/emitting layer/hole transport layer/hole injecting layer/anode 2) the cathode/electron injecting layer/electron transport layer/emitting layer/hole transport layer/hole injecting layer/hole buffer layer/anode 3) the cathode/electron buffer layer/electron injecting layer/electron transport layer/emitting layer/hole transport layer/hole injecting layer/anode 4) the cathode/electron buffer layer/electron injecting layer/electron transport layer/emitting layer/hole transport layer/hole buffer layer/anode 5) the cathode/electron injecting layer/electron transport layer/emitting layer/hole transport layer/hole buffer layer/hole injecting layer/anode 6) the cathode/electron injecting layer/electron buffer layer/electron transport layer/emitting layer/hole transport layer/hole injecting layer/anode d) Inverted Slim Structure 1) the cathode/electron injecting layer/electron transport layer/emitting layer/hole injection transport layer/anode 2) the cathode/electron injecting layer/electron transport layer/emitting layer/hole injection transport layer/hole buffer layer/anode 3) the cathode/electron buffer layer/electron injection transport layer/emitting layer/hole transport layer/hole injecting layer/anode 4) the cathode/electron buffer layer/electron injection transport layer/emitting layer/hole transport layer/hole buffer layer/anode 5) the cathode/electron injecting layer/electron transport layer/emitting layer/hole buffer layer/hole injection transport layer/anode 6) the cathode/electron injection transport layer/electron buffer layer/emitting layer/hole transport layer/hole injecting layer/anode As a method for driving the organic light emitting diode, either a passive matrix method or an active matrix method may be used. The passive matrix method has an advantageous effect of simple manufacturing process and less investment cost by forming the anode and the cathode to intersect at right angles and selecting and driving a line. However, the passive matrix method has a disadvantage of high current consumption when embodying a wide screen. The active matrix method has an advantageous effect of low current consumption, excellent image quality, long service life, and applicability to medium and large sized product by forming an active element such as a thin film transistor and a capacitive element on each pixel.

According to the above-mentioned embodiments, the organic light emitting display is provided on at least one side of the substrate with the electrostatic discharge circuit, and thus can prevent the pixels or the drives from being damaged due to the electrostatic charge generated by environmental causes, whether internal or external to the display. At this time, the electrostatic discharge circuit includes the protruding electrode that concentrates the static electricity charge and forms a high electric field, and thus can dissipate more easily the electrostatic discharge current.

As described above, the organic light emitting display has an advantageous effect that can prevent the pixels or the drivers from being damaged due to the electrostatic discharge by forming the electrostatic discharge circuit on at least one side of the inner circumference of the substrate.

Furthermore, such an advantageous effect is attained that the break down of insulation between the protruding electrodes can be more facilitated by forming the protruding electrodes to extend horizontally on the gate electrode and the source/drain electrode of the electrostatic discharge circuit respectively, and thus the electrostatic discharge can be more easily dissipated.

Moreover, such an advantageous effect is attained that the electrostatic discharge can be dissipated using the semiconductor layer in addition to the gate electrode and the source/drain electrode by forming the semiconductor layer in the electrostatic discharge circuit, and thus the electrostatic discharge can be dissipated using more various paths.

In addition, such an advantageous effect is attained that the electrostatic discharge circuit can be selectively formed in an area where the electrostatic discharge is expected to occur or another area by separately forming the electrostatic discharge circuit on each side of the inner circumference of the substrate.

Although certain embodiments of the organic light emitting display have been described for illustrative purposes, those skilled in the art will appreciate that various modifications and changes thereof are possible without departing from the scope and spirit of the present invention.

What is claimed is:

1. An organic light emitting display, comprising:
    a substrate including a pixel area and a non-pixel area; and
    an electrostatic discharge circuit formed in the non-pixel area, the electrostatic discharge circuit comprising:
        a first electrode layer formed on the substrate, wherein the first electrode layer comprises:
            a first main body, and
            one or more extensions from the first main body;
        a first insulating layer formed on the first electrode layer; and
        a second electrode layer formed on the first insulating layer, wherein the second electrode layer comprises:
            a second main body substantially parallel to the first main body, and
            a plurality of extensions from the second main body, wherein the extensions of the first main body extend from the first main body toward the second main body and the and the extensions of the second main body extend from the second main body toward the first main body, and wherein at least one of the extensions of the first main body is between two extensions of the second main body,
        wherein at least one of the first electrode layer and the second electrode layer comprises a protruding electrode formed to extend from an extension of the at least one first and second electrode layer toward an extension of the other of the first electrode layer and the second electrode layer, wherein the second electrode layer is farther from or closer to the substrate than the first electrode layer, and wherein the first electrode layer does not overlap the second electrode layer.

2. The organic light emitting display as claimed in claim 1, wherein the protruding electrode substantially has the shape of any of a saw-tooth, a triangle, a rectangle, a pentagon and a trapezoid.

3. The organic light emitting display as claimed in claim 1, wherein the protruding electrode comprises a first protruding electrode included in the first electrode layer, and the first protruding electrode is formed to point horizontally toward the second electrode layer.

4. The organic light emitting display as claimed in claim 1, wherein the protruding electrode comprises an additional protruding electrode extending horizontally toward the other of the first electrode layer and the second electrode layer.

5. The organic light emitting display as claimed in claim 1, wherein each of the first electrode layer and the second electrode layer comprises a protruding electrode formed to extend horizontally toward the other of the first electrode layer and the second electrode layer.

6. The organic light emitting display as claimed in claim 5, wherein the protruding electrodes extend toward one another.

7. The organic light emitting display as claimed in claim 1, wherein the electrostatic discharge circuit further comprises a semiconductor layer formed between the substrate and the first electrode layer.

8. The organic light emitting display as claimed in claim 7, wherein the electrostatic discharge circuit further comprises a second insulating layer formed between the semiconductor layer and the first electrode layer.

9. The organic light emitting display as claimed in claim 7, wherein the electrostatic discharge circuit further comprises a buffer layer formed between the substrate and the semiconductor layer.

10. The organic light emitting display as claimed in claim 1, wherein the electrostatic discharge circuit further comprises a protective layer formed on the second electrode layer.

11. The organic light emitting display as claimed in claim 10, wherein the electrostatic discharge circuit further comprises a third electrode layer formed on the protective layer and is electrically coupled with the second electrode layer through a via hole.

12. The organic light emitting display as claimed in claim 1, wherein the non-pixel area further comprises:
   at least one driver configured to drive a pixel in the pixel area; and
   a pad configured to electrically couple the pixel and the driver with an external module.

13. The organic light emitting display as claimed in claim 12, wherein the pad is formed on at least one side of the inner circumference of the substrate.

14. The organic light emitting display as claimed in claim 13, wherein the electrostatic discharge circuit is formed on at least one side of the inner circumference of the substrate other than a side on which the pad is formed.

15. The organic light emitting display as claimed in claim 1, wherein the electrostatic discharge circuit is separately formed on each side of the inner circumference of the substrate.

16. The organic light emitting display as claimed in claim 1, wherein the electrostatic discharge circuit is integrally formed to substantially surround the inner circumference of the substrate.

17. The organic light emitting display as claimed in claim 12, wherein any of the first electrode layer and the second electrode layer is electrically coupled with a ground pad.

18. The organic light emitting display as claimed in claim 1, wherein the first electrode layer and the second electrode layer comprises at least one of aluminum, aluminum-neodymium, chrome, molybdenum, molybdenum-tungsten and titanium.

19. The organic light emitting display as claimed in claim 1, wherein the first insulating layer comprises at least one of silicon oxide, silicon nitride and an organic matter.

20. An organic light emitting display comprising:
   a substrate including a pixel area and a non-pixel area; and
   a transistor-like electrostatic discharge circuit in the non-pixel area, the electrostatic discharge circuit comprising:
      a semiconductor layer formed on the substrate;
      a gate insulating layer formed on the semiconductor layer;
      a gate electrode formed on the gate insulating layer, wherein the gate electrode comprises:
         a first main body, and
         one or more extensions from the first main body;
      an insulating interlayer formed to cover the gate electrode; and
      a source/drain electrode formed on the insulating interlayer, wherein the source/drain electrode comprises:
         a second main body substantially parallel to the first main body, and
         a plurality of extensions from the second main body,
      wherein the extensions of the first main body extend from the first main body toward the second main body and the extensions of the second main body extend from the second main body toward the first main body,
      wherein at least one of the extensions of the first main body is between two extensions of the second main body,
      wherein at least one of the gate electrode and the source/drain electrode comprises a protruding electrode formed to extend from an extension of the at least one gate electrode and source/drain electrode toward an extension of the other of the gate electrode and source/drain electrode, wherein the source/drain electrode is farther from or closer to the substrate than the gate electrode, and herein the gate electrode does not overlap the source/drain electrode.

21. The organic light emitting display as claimed in claim 20, wherein the source/drain electrode comprises a second protruding electrode formed to extend horizontally toward the gate electrode.

22. The organic light emitting display as claimed in claim 21, wherein the first protruding electrode and the second protruding electrode are formed in the shape of any of a saw-tooth, a triangle, a rectangle, a pentagon and a trapezoid.

23. The organic light emitting display as claimed in claim 21, wherein the electrostatic discharge circuit is formed such that the first protruding electrode and the second protruding electrode extend toward one another.

24. The organic light emitting display as claimed in claim 20, wherein at least one of the gate electrode and the source/drain electrode is electrically coupled with a ground pad.

25. The organic light emitting display as claimed in claim 20, wherein the electrostatic discharge circuit further comprises a buffer layer formed between the substrate and the semiconductor layer.

26. The organic light emitting display as claimed in claim 20, wherein the electrostatic discharge circuit further comprises a protective layer formed on the source/drain electrode.

27. The organic light emitting display as claimed in claim 26, wherein the electrostatic discharge circuit further comprises an electrode layer formed on the protective layer and is electrically coupled with the source/drain electrode.

* * * * *